(12) United States Patent
Kurokawa

(10) Patent No.: US 10,566,303 B2
(45) Date of Patent: Feb. 18, 2020

(54) SEMICONDUCTOR ELEMENT

(71) Applicant: Murata Manufacturing Co., Ltd., Kyoto (JP)

(72) Inventor: Atsushi Kurokawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/209,391

(22) Filed: Dec. 4, 2018

(65) Prior Publication Data
US 2019/0172806 A1 Jun. 6, 2019

(30) Foreign Application Priority Data

Dec. 6, 2017 (JP) ................. 2017-234277

(51) Int. Cl.
| | | |
|---|---|---|
| *H01L 29/80* | (2006.01) | |
| *H01L 23/00* | (2006.01) | |
| *H01L 29/417* | (2006.01) | |
| *H01L 29/08* | (2006.01) | |
| *H01L 29/06* | (2006.01) | |
| *H01L 27/082* | (2006.01) | |
| *H01L 29/205* | (2006.01) | |

(Continued)

(52) U.S. Cl.
CPC ............. *H01L 24/13* (2013.01); *H01L 24/05* (2013.01); *H01L 27/0823* (2013.01); *H01L 27/098* (2013.01); *H01L 29/0649* (2013.01); *H01L 29/0817* (2013.01); *H01L 29/205* (2013.01); *H01L 29/41708* (2013.01); *H01L 29/41758* (2013.01); *H01L 29/42304* (2013.01); *H01L 29/42316* (2013.01); *H01L 29/452* (2013.01); *H01L 29/7371* (2013.01); *H01L 2224/0401* (2013.01); *H01L 2224/05666* (2013.01); *H01L 2224/13024* (2013.01); *H01L 2224/13083* (2013.01); *H01L 2224/13111* (2013.01); *H01L 2224/13147* (2013.01); *H01L 2224/13155* (2013.01); *H01L 2924/13051* (2013.01); *H01L 2924/13063* (2013.01); *H01L 2924/351* (2013.01)

(58) Field of Classification Search
CPC ..... H01L 24/13; H01L 24/05; H01L 27/0823; H01L 27/098; H01L 29/0649; H01L 29/0817
USPC ....................................................... 257/256
See application file for complete search history.

(56) References Cited

U.S. PATENT DOCUMENTS

| | | | |
|---|---|---|---|
| 8,314,472 B2 | 11/2012 | Parkhurst et al. | |
| 2004/0089941 A1* | 5/2004 | Mamitsu | H01L 23/051 257/718 |
| 2018/0006144 A1 | 1/2018 | Sasaki et al. | |

FOREIGN PATENT DOCUMENTS

JP    2016-103540 A    6/2016

* cited by examiner

*Primary Examiner* — Tan N Tran
(74) *Attorney, Agent, or Firm* — Pearne & Gordon LLP

(57) ABSTRACT

A transistor includes a semiconductor region provided on a substrate and three different terminal electrodes. At least one terminal electrode has an isolated electrode structure composed of a plurality of conductor patterns. A bump, which electrically connects the plurality of conductor patterns to each other, is arranged on the terminal electrode having the isolated electrode structure. A stress-relaxing layer, which is composed of a metal material containing a high-melting-point metal, is arranged between the semiconductor region of the transistor and the bump. No current path for connecting the plurality of conductor patterns to each other is arranged between the conductor patterns and the bump.

20 Claims, 13 Drawing Sheets

(51) Int. Cl.
*H01L 29/45* (2006.01)
*H01L 27/098* (2006.01)
*H01L 29/423* (2006.01)
*H01L 29/737* (2006.01)

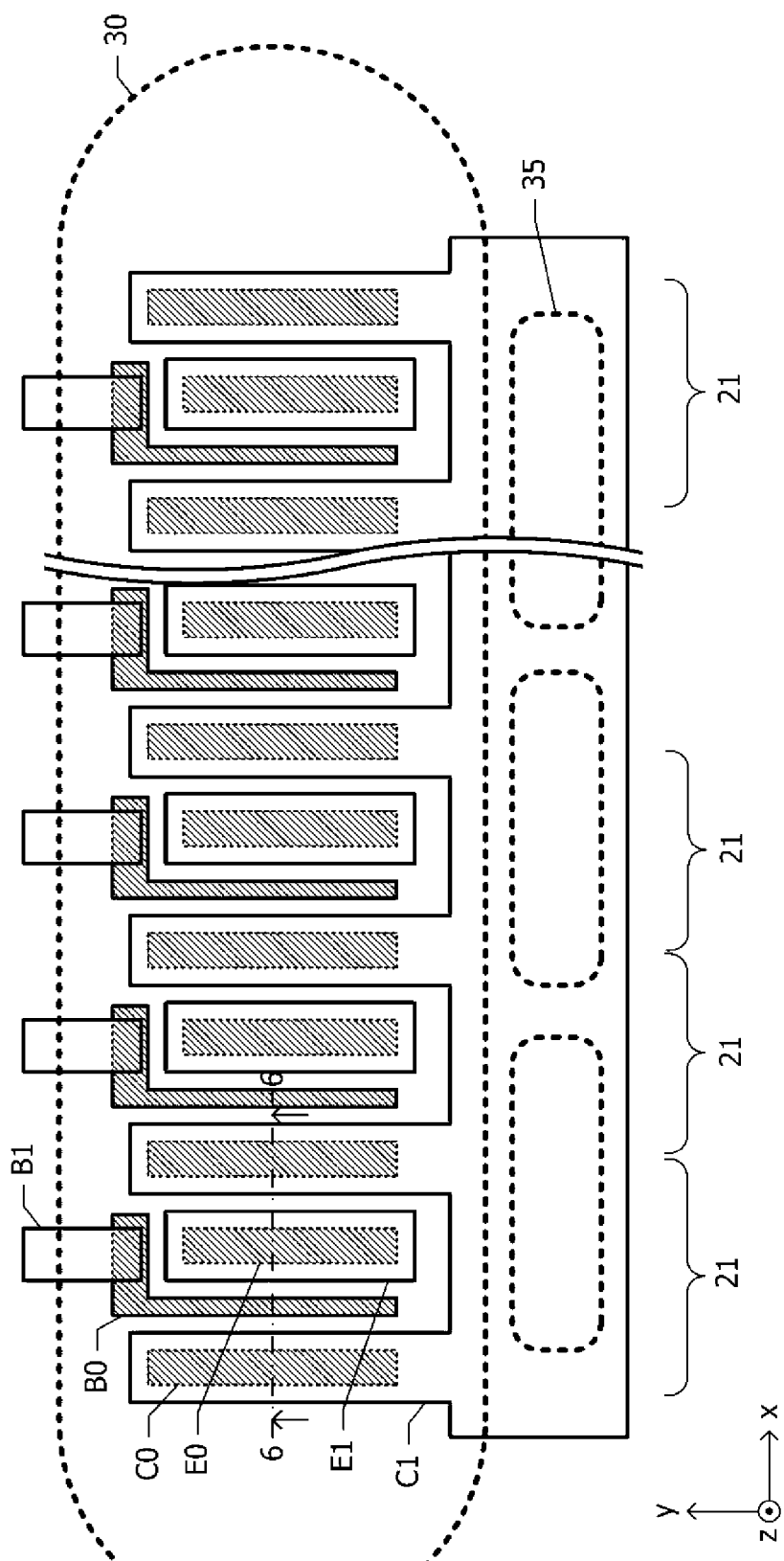

SEMICONDUCTOR ELEMENT

This application claims priority from Japanese Patent Application No. 2017-234277 filed on Dec. 6, 2017. The content of this application is incorporated herein by reference in its entirety.

BACKGROUND OF THE DISCLOSURE

1. Field of the Disclosure

The present disclosure relates to a semiconductor element.

2. Description of the Related Art

A technique is widely known in which a semiconductor element is mounted on a mounting substrate via a bump and the bump is utilized as a heat-dissipating path. For example, refer to Japanese Unexamined Patent Application Publication No. 2016-103540 and U.S. Pat. No. 8,314,472.

In a semiconductor device disclosed in Japanese Unexamined Patent Application Publication No. 2016-103540, a heterojunction bipolar transistor (HBT) is formed by connecting in parallel a plurality of unit transistors formed on a compound semiconductor substrate. A bump is electrically connected to the emitters of the plurality of unit transistors. The plurality of unit transistors are arrayed in a first direction, and the bump is arranged so as to extend in the first direction.

In a semiconductor device disclosed in U.S. Pat. No. 8,314,472, a current path contained in a wiring line layer is connected to a conductive pillar. The conductive pillar is connected to the emitter of an HBT.

Each of the plurality of unit transistors disclosed in Japanese Unexamined Patent Application Publication No. 2016-103540 has three terminals consisting of a collector, a base, and an emitter. The collectors, the bases, and the emitters of the plurality of unit transistors are respectively connected to each other by collective wiring lines. It is necessary to make the wiring lines crossed with each other in order to connect the three terminals to the collective wiring lines, and therefore at least two wiring line layers are required.

In the semiconductor device disclosed in U.S. Pat. No. 8,314,472, thermal stress is generated in a semiconductor layer due to a difference in thermal expansion coefficient between the conductive pillar (bump) and the semiconductor layer. Due to this thermal stress, decreased reliability, variations in electrical characteristics, inferior electrical characteristics, and so on are likely to occur in the semiconductor device.

BRIEF SUMMARY OF THE DISCLOSURE

An object of the present disclosure is to provide a semiconductor element that can reduce the thermal stress generated due to a difference in thermal expansion coefficient between a bump and a semiconductor layer, and that can realize a reduction in the number of wiring line layers.

A semiconductor element according to a first preferred embodiment of the present disclosure includes:

a transistor that includes a semiconductor region provided on a substrate and three different terminal electrodes, and in which at least one of the terminal electrodes has an isolated electrode structure consisting of a plurality of conductor patterns;

a bump that is arranged on the at least one terminal electrode having the isolated electrode structure and that electrically connects the plurality of conductor patterns to each other; and a stress-relaxing layer that is arranged between the semiconductor region of the transistor and the bump and is composed of a metal material containing a high-melting-point metal.

No current path for connecting the plurality of conductor patterns to each other is arranged between the conductor patterns and the bump.

Thermal stress generated in the semiconductor region of the transistor can be reduced by arranging the stress-relaxing layer. Since the plurality of conductor patterns of the terminal electrode having the isolated electrode structure are electrically connected to each other by the bump, there is no need to arrange a wiring line layer for connecting the plurality of conductor patterns to each other. Therefore, it is possible to reduce the number of wiring line layers.

BRIEF DESCRIPTION OF THE SEVERAL VIEWS OF THE DRAWINGS

FIG. 5 is a plan view of a semiconductor element according to a second embodiment;

DETAILED DESCRIPTION OF THE DISCLOSURE

First Embodiment

A semiconductor element according to a first embodiment will be described while referring to FIGS. 1, 2, and 3.

Figure 1:
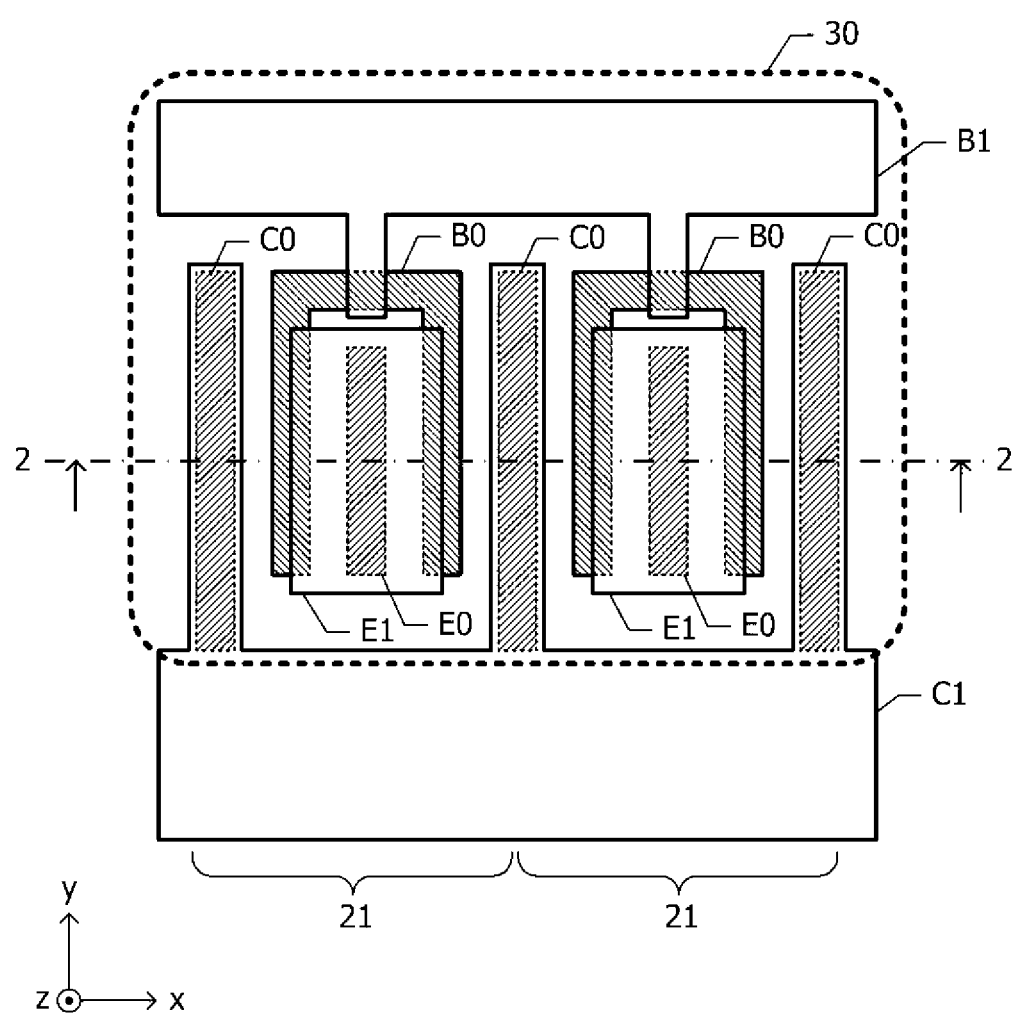
FIG. 1 is a plan view of a semiconductor element according to a first embodiment.

FIG. 1 is a plan view of the semiconductor element according to the first embodiment. A xyz orthogonal coordinate system is defined such that an upper surface of a substrate of the semiconductor element lies in a xy plane and a direction that is normal to this upper surface is a positive z axis direction. The semiconductor element according the first embodiment includes a transistor, wiring lines that are connected to the transistor, and a bump. The transistor includes two unit transistors 21 that are connected in parallel with each other.

The two unit transistors 21 are arranged next to each other in the x axis direction. Each unit transistor 21 includes an emitter layer, a base layer, and a collector layer, and an emitter electrode E0, a base electrode B0, and a collector electrode C0, which are respectively connected to the corresponding layers. In FIG. 1, the emitter electrodes E0, the base electrodes B0, and the collector electrodes C0 are shaded with hatching.

Each emitter electrode E0 has a substantially rectangular planar shape that extends in the y axis direction. The base electrodes B0 are disposed so as to surround the corresponding emitter electrodes E0 on three sides, namely, the positive and negative sides in the x axis direction and the positive side in the y direction. The collector electrodes C0 are arranged on both sides of the base electrodes B0 in the x axis direction. The collector electrode C0 arranged between the base electrodes B0 of the two unit transistors 21 is shared by the two unit transistors 21.

The semiconductor element according to this embodiment includes an emitter wiring line E1, a collector wiring line C1, and a base wiring line B1, which are arranged in a wiring line layer of a first layer. The emitter wiring line E1 of the first layer consists of two isolated conductor patterns that are arranged so as to respectively overlap the two emitter electrodes E0, and these conductor patterns are respectively electrically connected to the underlying emitter electrodes E0.

The collector wiring line C1 of the first layer has a substantially comb-like planar shape. The comb-tooth parts of the collector wiring line C1 of the first layer are arranged so as to be respectively overlapped with the collector electrodes C0. The plurality of conductor patterns constituting the collector electrodes C0 are connected to each other by the collector wiring line C1 of the first layer.

The base wiring line B1 of the first layer connects the base electrodes B0 of the two unit transistors 21 to each other.

A bump 30 is arranged so as to be overlapped with the two conductor patterns of the emitter wiring line E1 of the first layer. The bump 30 is electrically connected to the two conductor patterns of the emitter wiring line E1 of the first layer. The two conductor patterns constituting the emitter electrodes E0 of the two unit transistors 21 are electrically connected to each other by the bump 30.

Figure 2:
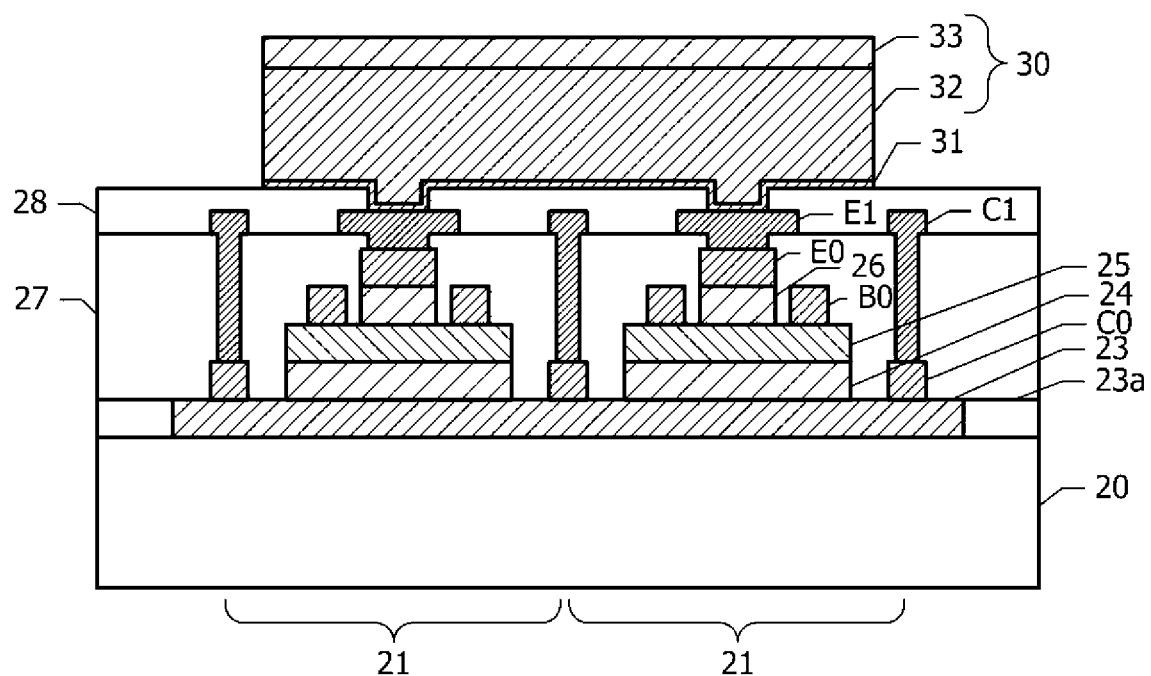
FIG. 2 is a sectional view taken along a one-dot dash line 2-2 in FIG. 1.

FIG. 2 is a sectional view taken along a one-dot dash line 2-2 in FIG. 1. A sub collector layer 23 is arranged on a substrate 20 that is composed of semi-insulating GaAs. The sub collector layer 23 is formed of high-concentration n-type GaAs and has a thickness of around 0.5 µm, for example. A part of the sub collector layer 23 serves as an isolation region 23a that is made insulating through ion injection. The sub collector layer 23 is shared by the two unit transistors 21.

A collector layer 24, a base layer 25, and an emitter layer 26 are stacked in this order on the sub collector layer 23 in each unit transistor 21. The collector layer 24 is formed of n-type GaAs and has a thickness of around 1 µm, for example. The base layer 25 is formed of p-type GaAs and has a thickness of around 100 nm, for example. The base layer 25 and the collector layer 24 have the same planar shape and form a collector mesa.

The emitter layer 26 is arranged on a part of the base layer 25. For example, the emitter layer 26 includes an n-type InGaP layer having a thickness of around 30-40 nm, a high-concentration n-type GaAs layer having a thickness of around 100 nm, and a high-concentration n-type InGaAs layer having a thickness of around 100 nm, which are stacked in order from the base layer 25 side. The high-concentration n-type InGaAs layer is for achieving ohmic contact with the emitter electrode E0 arranged thereon.

The collector electrodes C0 are arranged on the sub collector layer 23 and are ohmically connected to the sub collector layer 23. Each of the collector electrodes C0 consists of three conductor patterns, and the three conductor patterns are arranged between and outside the two collector mesas in the x axis direction. For example, each of the collector electrodes C0 is formed by stacking an AuGe film having a thickness of around 60 nm, a Ni film having a thickness of around 10 nm, and an Au film having a thickness of around 200 nm.

The base electrodes B0 are arranged on the base layers 25 and are ohmically connected to the base layers 25. In the cross section illustrated in FIG. 2, the base electrodes B0 are arranged on both sides of the corresponding emitter layers 26. For example, each of the base electrodes B0 is formed by stacking a Ti film having a thickness of around 50 nm, a Pt film having a thickness of around 50 nm, and an Au film having a thickness of around 200 nm.

The emitter electrodes E0 are arranged on the emitter layers 26. For example, Ti films having a thickness of around 50 nm are used as the emitter electrodes E0.

An insulating film 27 is arranged so as to cover the unit transistors 21. For example, a multilayer film consisting of a SiN film and a resin film such as a polyimide film is used as the insulating film 27. The upper surface of the insulating film 27 is made flat. The insulating film 27 may be formed of a single layer consisting of a SiN film.

The emitter wiring lines E1 and the collector wiring line C1 of the first layer are arranged on the insulating film 27. The emitter wiring lines E1 are electrically connected to the emitter electrodes E0 via openings provided in the insulating film 27. The collector wiring line C1 of the first layer is electrically connected to the collector electrodes C0 via openings provided in the insulating film 27. Although not depicted in the cross section illustrated in FIG. 2, the base wiring line B1 (FIG. 1) of the first layer is also arranged on the insulating film 27. The base wiring line B1 is electrically connected to the base electrodes B0 via openings formed in the insulating film 27.

Each of the emitter wiring lines E1, the collector wiring lines C1, and the base wiring lines B1 in the first layer has a two-layer structure consisting of a Ti film having a thickness of around 50 nm and an Au film having a thickness of around 1 µm that is arranged on the Ti film.

An upper layer insulating film 28 is arranged on the insulating film 27 so as to cover the emitter wiring lines E1, the collector wiring lines C1, and the base wiring lines B1 of the first layer. For example, a SiN film or a multilayer film consisting of a SiN film and a resin film is used as the insulating film 28.

The bump 30 is arranged on the insulating film 28. The bump 30 is electrically connected to the emitter wiring lines E1 via openings provided for the emitter wiring lines E1 of the first layer in the insulating film 28. The bump 30 includes a metal post 32 and a solder layer 33 provided on the metal post 32. An under bump metal layer 31, serving as an underlayer, is arranged underneath the bump 30.

The under bump metal layer 31 is formed of Ti, for example. A Cu film having a thickness of around 50 μm is used as the metal post 32. For example, a Sn film having a thickness of around 30 μm is used as the solder layer 33. A barrier metal layer that is for preventing inter-diffusion and is composed of Ni or the like may be formed between the metal post 32 and the solder layer 33.

Next, favorable effects obtained as a result of adopting the structure of the semiconductor element according to the first embodiment will be described while comparing the semiconductor element of the first embodiment with a semiconductor element according to a comparative example illustrated in FIG. 3.

Figure 3:
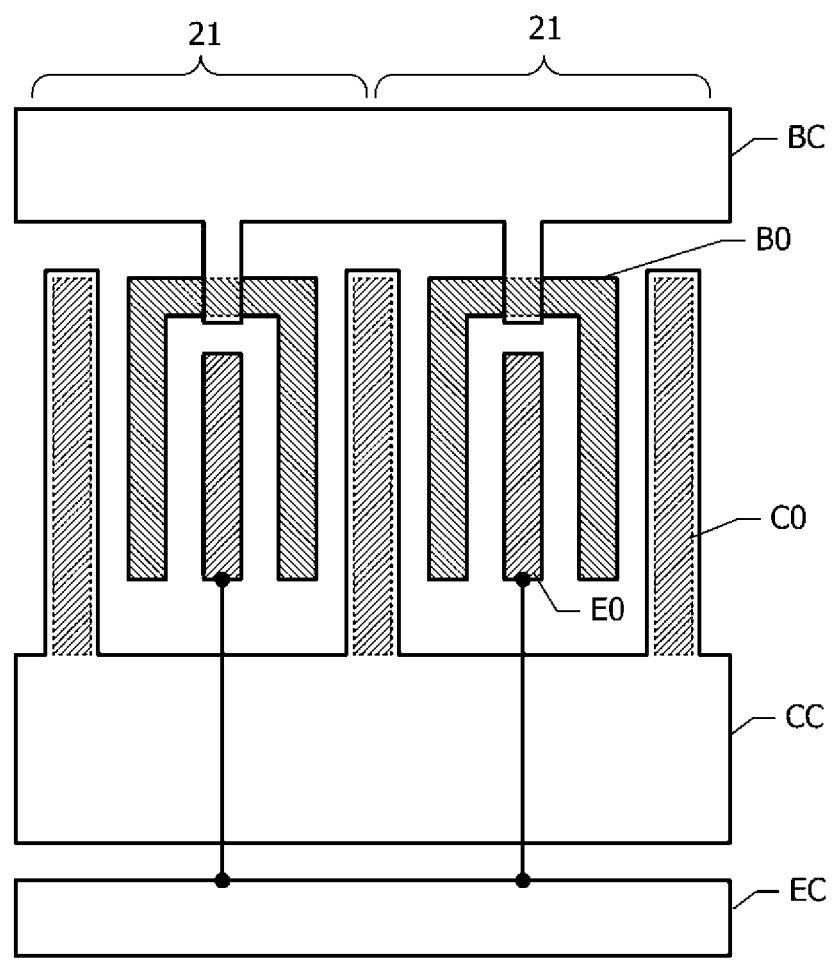
FIG. 3 is a schematic plan view of a semiconductor element according to a comparative example.

FIG. 3 is a schematic plan view of the semiconductor element according to the comparative example. A collector collective wiring line CC, an emitter collective wiring line EC, and a base collective wiring line BC are arranged in order to connect a plurality of unit transistors in parallel with each other. The collector collective wiring line CC connects a plurality of collector electrodes C0 to each other. The emitter collective wiring line EC connects a plurality of emitter electrodes E0 to each other. The base collective wiring line BC connects a plurality of base electrodes B0 to each other. Ordinarily, it is necessary to make at least two wiring lines crossed with each other in order to respectively connect the three types of electrodes to the corresponding collective wiring lines. For example, in the comparative example illustrated in FIG. 3, wiring lines that are for connecting the emitter electrodes E0 to the emitter collective wiring line EC are crossed with the collector collective wiring line CC. Therefore, at least two wiring line layers are required in order to connect the plurality of unit transistors 21 in parallel with each other.

In the first embodiment, as illustrated in FIG. 1, the collector wiring line C1 and the base wiring line B1 of the first layer respectively serve as a collector collective wiring line and a base collective wiring line. Each of the emitter wiring lines E1 of the first layer is arranged for each of the two conductor patterns of the emitter electrodes E0 and does not serve as an emitter collective wiring line. In the first embodiment, the bump 30 connects the two conductor patterns of the emitter electrodes E0 to each other and serves as an emitter collective wiring line. Thus, in addition to its original function of serving as an external connection terminal, the bump 30 also functions as a collective wiring line that connects the two conductor patterns of the emitter electrodes E0 to each other. Therefore, there is no need to provide wiring lines that are crossed with the collector collective wiring line CC as illustrated in FIG. 3.

As described above, since there is no need to provide two wiring line layers in the first embodiment, the number of wiring line layers can be reduced compared with the comparative example (FIG. 3). As a result of the number of wiring line layers being reduced, a reduction in manufacturing cost can be achieved.

Next, favorable effects obtained as a result of arranging the under bump metal layer 31 (FIG. 2) will be described. Thermal stress is generated in semiconductor layers such as the emitter layers 26 due to the differences between the thermal expansion coefficients of the emitter layers 26, base layers 25, and the collector layers 24 that are composed of a semiconductor such as GaAs or InGaAs and the thermal expansion coefficients of the metal post 32 and the solder layer 33 that are composed of Cu, Sn, and so on. For example, the thermal expansion coefficient of GaAs is around 6 ppm/° C. and the thermal expansion coefficient of InGaP lies in a range of 5-6 ppm/° C., whereas the thermal coefficient of Cu is 17 ppm/° C. and the thermal expansion coefficient of Sn is 22 ppm/° C. In addition, the thermal expansion coefficient of a printed circuit board on which a semiconductor element is mounted also typically lies in the range of 15-20 ppm.

The thermal expansion coefficient of Ti used as the under bump metal layer 31 is 8.6 ppm/° C. and is close to the thermal expansion coefficient of a semiconductor layer. Therefore, the under bump metal layer 31 functions as a stress-relaxing layer that relaxes the thermal stress generated in the semiconductor layers.

When strain is generated in a semiconductor layer due to thermal stress, the current amplification factor of the bipolar transistor during electrical conduction operation at a high temperature is reduced. In the first embodiment, since the thermal stress generated in the semiconductor layers is reduced, the reduction of the current amplification factor can be suppressed.

Furthermore, in the first embodiment, the emitter layers 26 and so forth that act as heat sources are arranged directly below the bump 30. Heat transmission paths from the heat sources to the bump 30 are short, and therefore good heat dissipation characteristics can be secured via the bump 30. As a result, a reduction in the high-frequency characteristics of a bipolar transistor due to an increase in the temperature of the bipolar transistor can be suppressed.

Next, a first modification of the first embodiment will be described. In the first embodiment, Ti is used for the under bump metal layer 31 (FIG. 2), but a different high-melting-point metal, a compound containing a high-melting-point metal, or an alloy containing a high-melting-point metal may be used instead. Examples of a high-melting-point metal other than Ti include Ta, Mo, Cr, and W. Examples of compounds that contain a high-melting-point metal include nitrides of a high-melting-point metal such as TaN and TiN and silicides of a high-melting-point metal such as MoSi and WSi. TiW is an example of an alloy that contains a high-melting-point metal.

A multilayer structure that includes a Ti film, which has good adhesion to the underlying insulating film 28 (FIG. 1) composed of SiN or the like, and a film having a high stress relaxation action such as W arranged on the Ti film may be adopted for the under bump metal layer 31. Thus, the under bump metal layer 31 may have a multilayer structure composed of a plurality of metal films.

Figure 4A:
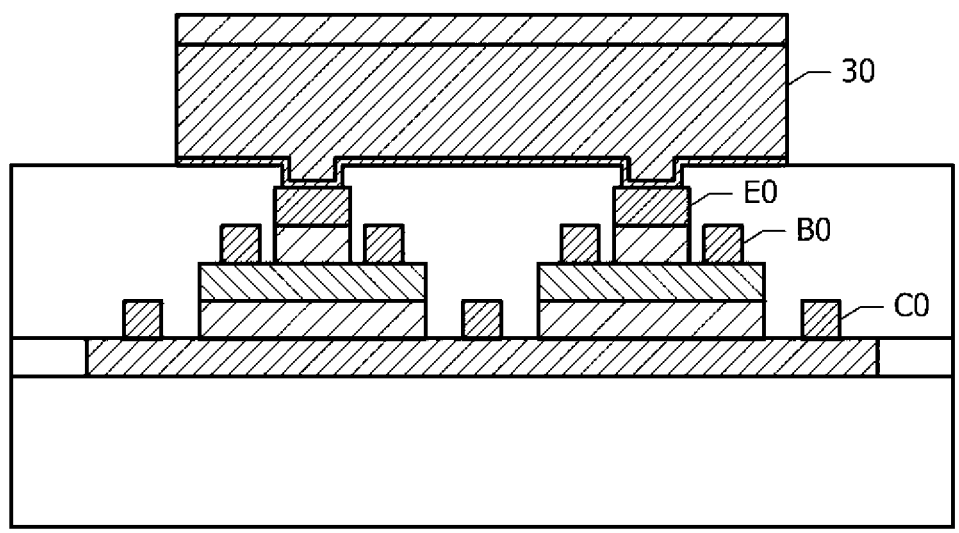
FIG. 4A is a sectional view of a semiconductor element according to a second modification of the first embodiment.
Figure 4B:
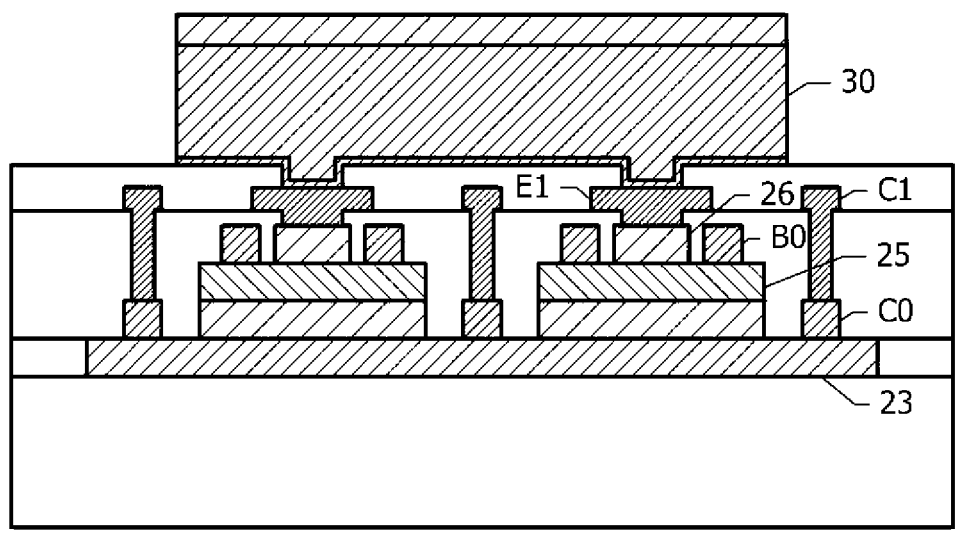
FIG. 4B is a sectional view of a semiconductor element according a third modification of the first embodiment.

Next, a second modification and a third modification of the first embodiment will be additionally described while referring to FIGS. 4A and 4B. FIG. 4A is a sectional view of a semiconductor element according to the second modification of the first embodiment. In the first embodiment, the emitter electrodes E0 and the bump 30 are connected to each other via the emitter wiring line E1 (FIG. 2) of the first layer. In the second modification, the wiring line layers of the first layer are omitted and the emitter electrodes E0 and the bump 30 are electrically connected to each other without a wiring line layer being interposed therebetween. In addition, base and collector bumps are also electrically connected to the corresponding base electrodes B0 and collector electrodes C0 without wiring line layers being interposed therebetween.

In the second modification, since there is no need to arrange wiring line layers between the emitter electrodes E0, the base electrodes B0, and the collector electrodes C0, and the bump 30, the manufacturing cost can be further reduced.

FIG. 4B is a sectional view of a semiconductor element according to the third modification of the first embodiment. In the first embodiment, the emitter wiring lines E1 of the first layer are connected to the emitter layers 26 via the emitter electrodes E0 (FIG. 2). In the third modification, the emitter electrodes E0 are omitted and the emitter wiring lines E1 of the first layer are directly connected to the emitter layers 26. In other words, the emitter wiring lines E1 of the first layer also serve as the emitter electrodes E0 (FIG. 2) of the first embodiment.

In addition, the collector electrodes C0 may be omitted and the collector wiring lines C1 of the first layer may be made to directly ohmically contact with the sub collector layer 23. In addition, the base electrodes B0 may be omitted and the base wiring line B1 (FIG. 1) of the first layer may be made to directly ohmically contact with the base layers 25.

Next, a fourth modification of the first embodiment will be described. The HBT included in the semiconductor element according to the first embodiment includes three types of terminal electrodes, namely, the emitter electrodes E0, the base electrodes B0, and the collector electrodes C0. In the semiconductor element according to the first embodiment, a plurality of collector electrodes C0 are electrically connected to each other via the collector wiring line C1 of the first layer, and a plurality of base electrodes B0 are electrically connected to each other via the base wiring line B1 of the first layer. In contrast, the plurality of conductor patterns constituting the emitter electrodes E0 are electrically connected to each other via the bump 30, and a current path for connecting the plurality of conductor patterns of the emitter electrodes E0 to each other is not arranged in a wiring line layer between the emitter electrodes E0 and the bump 30.

In the fourth modification, the plurality of conductor patterns constituting the collector electrodes C0 are connected to each other by a bump, and a current path for connecting the plurality of conductor patterns constituting the collector electrodes C0 to each other is not arranged between the collector electrodes C0 and the bump. The plurality of conductor patterns constituting the emitter electrodes E0 are electrically connected to each other by the emitter wiring lines E1 of the first layer.

The plurality of conductor patterns constituting the base electrodes B0 may also be connected to each other by a bump, and a current path for connecting the plurality of conductor patterns constituting the base electrodes B0 to each other may not be arranged between the base electrodes B0 and the bump.

Furthermore, in the first embodiment, each of the emitter electrodes E0 has a substantially rectangular planar shape, but may instead have another shape, for example, a substantially polygonal shape such as a substantially octagonal shape. Each of the underlying emitter layers 26 may also have a substantially polygonal planar shape such as a substantially octagonal shape so as match the shape of each of the emitter electrodes E0.

Second Embodiment

Next, a semiconductor element according to a second embodiment will be described while referring to FIGS. 5, 6, and 7. Hereafter, the description of the parts of the configuration that are the same as in the semiconductor element according to the first embodiment is omitted.

FIG. 5 is a plan view of the semiconductor element according to the second embodiment. In the first embodiment, two unit transistors 21 (FIG. 1) are connected in parallel with each other, whereas in the second embodiment, an HBT is formed by connecting a plurality of unit transistors 21 greater than or equal to three, for example, ten unit transistors 21 in parallel with each other. The ten unit transistors 21 are arranged next to each other in the x axis direction. Each unit transistor 21 includes an emitter electrode E0, a base electrode B0, and a collector electrode C0. In FIG. 5, the emitter electrodes E0, the base electrodes B0, and the collector electrodes C0 are shaded with hatching.

The emitter wiring lines E1 of the first layer are formed of ten conductor patterns so as to correspond to the ten emitter electrodes E0. The collector wiring lines C1 of the first layer connect the plurality of conductor patterns constituting the collector electrodes C0 to each other. A plurality of base wiring lines B1 of the first layer are respectively connected to the plurality of conductor patterns constituting the base electrodes B0.

In the first embodiment, each base electrode B0 is arranged on both sides of the corresponding emitter electrode E0 in the x axis direction, whereas in the second embodiment, each of the base electrodes B0 is arranged on only one side (negative x axis side) of each of the emitter electrodes E0.

A bump 30 has substantially racetrack-like shape obtained by connecting semicircles to both ends of a rectangle that extends in the x axis direction. A plurality of collector bumps 35 are arranged inside the collector wiring line C1 of the first layer in a plan view, and the collector wiring lines C1 of the first layer are electrically connected to the collector bumps 35.

Figure 6:
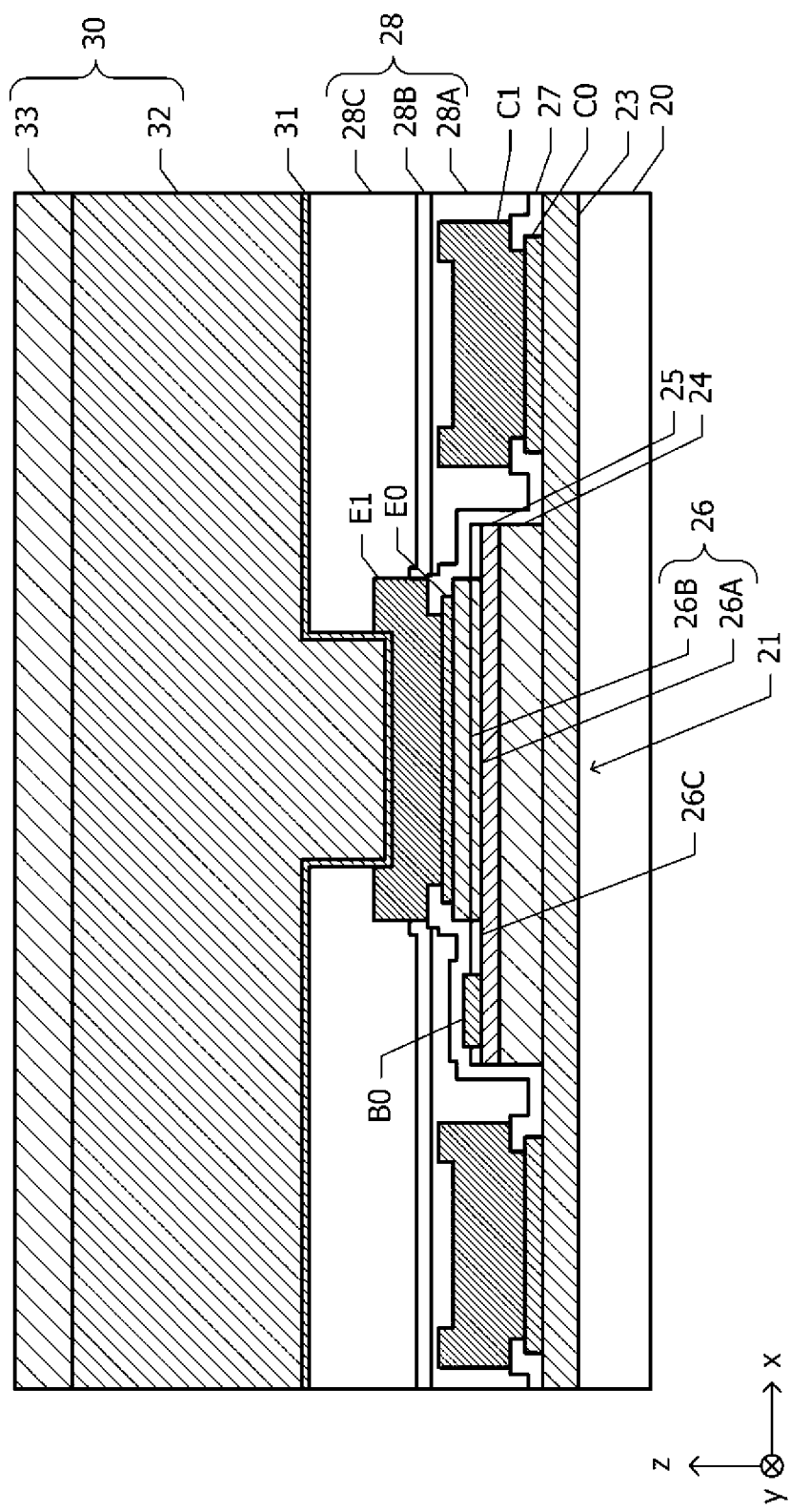
FIG. 6 is a sectional view taken along a one-dot dash line 6-6 in FIG. 5.

FIG. 6 is a sectional view taken along a one-dot dash line 6-6 in FIG. 5. The configurations of the substrate 20, the collector layer 24, and the base layer 25 are the same as the configurations in the first embodiment. The emitter layer 26 includes an n-type InGaP layer, a high-concentration n-type GaAs layer, and a high-concentration n-type InGaAs layer similarly to the emitter layers 26 (FIG. 2) of the semiconductor element according to the first embodiment.

In the second embodiment, the bottommost n-type InGaP layer is arranged over the entire upper surface of the base layer 25. An emitter mesa 26B, composed of the n-type GaAs layer and the n-type InGaAs layer, is arranged on a part of the n-type InGaP layer. The region of the n-type InGaP layer on which the emitter mesa 26B is not arranged is depleted. The depleted region is called a ledge layer 26C. The region of the n-type InGaP layer that is overlapped with the emitter mesa 26B is called a intrinsic emitter layer 26A. The intrinsic emitter layer 26A and the emitter mesa 26B correspond to the emitter layer 26 (FIG. 2) of the semiconductor element according to the first embodiment.

Each of the base electrodes B0 is arranged inside an opening provided in the ledge layer 26C. The configurations of the emitter electrodes E0 and the collector electrodes C0 are the same as the configurations of the emitter electrodes E0 and the collector electrodes C0 (FIG. 2) of the semiconductor element according to the first embodiment.

An insulating film 27 composed of SiN is arranged so as to cover the unit transistors 21. In the first embodiment, the upper surface of the insulating film 27 (FIG. 2) is made flat, but the upper surface of the insulating film 27 is not made flat in the second embodiment.

The emitter wiring lines E1 and the collector wiring lines C1 of the first layer arranged on the insulating film 27 are respectively electrically connected to the emitter electrodes E0 and the collector electrodes C0 via openings provided in the insulating film 27. For example, an Al film having a thickness of around 1 μm is used for each of the emitter wiring lines E1 and the collector wiring lines C1 of the first layer.

An insulating film 28 covers the emitter wiring lines E1 and the collector wiring lines C1 of the first layer. The insulating film 28 has a three-layer structure consisting of a resin film 28A, a SiN film 28B, and a resin film 28C stacked in this order. The upper surface of the insulating film 28 is made flat. The structures of the under bump metal layer 31 and the bump 30 above the insulating film 28 are the same as those in the semiconductor element (FIG. 2) according to the first embodiment.

The intrinsic emitter layers 26A of the plurality of unit transistors 21 are connected to each other by the bump 30 via the emitter mesas 26B, the emitter electrodes E0, and the emitter wiring lines E1 of the first layer. The collector layers 24 of the plurality of unit transistors 21 are connected to each other by the collector wiring lines C1 of the first layer via the sub collector layer 23 and the collector electrodes C0.

The base layers 25 of the plurality of unit transistors 21 are connected to each other by the base wiring lines B1 (FIG. 1) of the first layer via the base electrodes B0. In FIG. 1, an example is illustrated in which a plurality of base electrodes B0 are connected to each other by the base wiring lines B1 of the first layer, but it is preferable that ballast resistors, high-frequency input capacitors, and so forth be connected to the base layers 25 of the unit transistors 21. The base layers 25 are connected to a bias circuit via a ballast resistor and are connected to a high-frequency input bump via a capacitor. The base layers 25 may be connected to the high-frequency input bump via a capacitor and a matching circuit on the same substrate.

The semiconductor element according to the second embodiment is mounted on a mounting substrate by connecting the emitter bump 30, the collector bumps 35 (FIG. 5), the high-frequency input bump, and so forth to lands or the like on the mounting substrate using solder. For example, a ceramic substrate such as an alumina substrate, a resin substrate, or the like is used as the mounting substrate.

Next, the results obtained by simulating the thermal stress generated in the emitter layer 26 will be described while referring to FIG. 7. In the simulation, the dimension (length) of the intrinsic emitter layer 26A (FIG. 6) in the y axis direction was 30 μm, and the dimension (width) of the intrinsic emitter layer 26A in the x axis direction was 4 μm. The thermal stress was calculated by extracting one intrinsic emitter layer 26A from among the ten intrinsic emitter layers 26A (FIG. 5). The bump 30 (FIG. 5) had a substantially racetrack-like shape obtained by connecting semicircles having a diameter of 75 μm to short sides of a rectangle having a width of 75 μm. The thickness of the resin films 28A and 28C was 1.5 μm, and the thickness of the SiN film 28B was 0.5 μm. The thermal stress generated in the intrinsic emitter layer 26A when the temperature of the semiconductor element was lowered from 230° C., which is in the vicinity of the bonding temperature of solder, to 150° C. was calculated.

Figure 7:
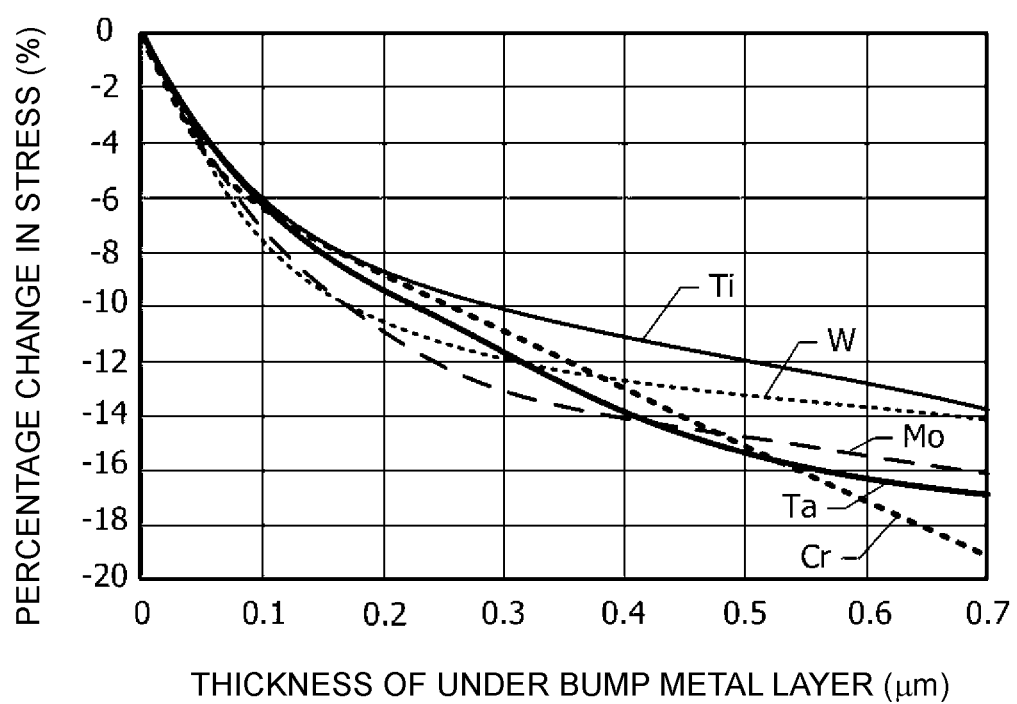
FIG. 7 is a graph illustrating the percentage change in the maximum value of the thermal stress generated in an intrinsic emitter layer in the second embodiment using a case in which an under bump metal layer functioning as a stress relaxing layer is not arranged as a reference.

FIG. 7 is a graph illustrating the percentage change in the maximum value of the thermal stress generated in the intrinsic emitter layer 26A using a case in which the under bump metal layer 31 functioning as a stress relaxing layer is not arranged as a reference. The horizontal axis represents the thickness of the under bump metal layer 31 that functions as a stress-relaxing layer in units of μm, and the vertical axis represents the stress percentage change in units of %. A negative stress percentage change means that the thermal stress is decreasing. When the absolute value of the stress percentage change is large, this means that the thermal stress is small. The simulation was performed using five different high-melting-point metals, namely, Ti, Ta, Mo, Cr, and W, for the under bump metal layer 31. The thermal expansion coefficients of Ti, Ta, Mo, Cr, and W are 8.6 ppm/° C., 6.3 ppm/° C., 5.1 ppm/° C., 4.9 ppm/° C., and 4.5 ppm/° C., respectively.

It is clear that the thermal stress falls as the thickness of the under bump metal layer 31 increases. This is because the thermal expansion coefficient of the material of the under bump metal layer 31 is close to the thermal expansion coefficient of the semiconductor material that constitutes the semiconductor element. From the simulations, it was confirmed that the under bump metal layer 31 has a function of relaxing thermal stress.

Third Embodiment

Next, a semiconductor element according to a third embodiment will be described while referring to FIGS. 8 and 9. Hereafter, the description of the parts of the configuration that are the same as in the semiconductor element according to the second embodiment illustrated in FIGS. 5, 6, and 7 will be omitted.

Figure 8:
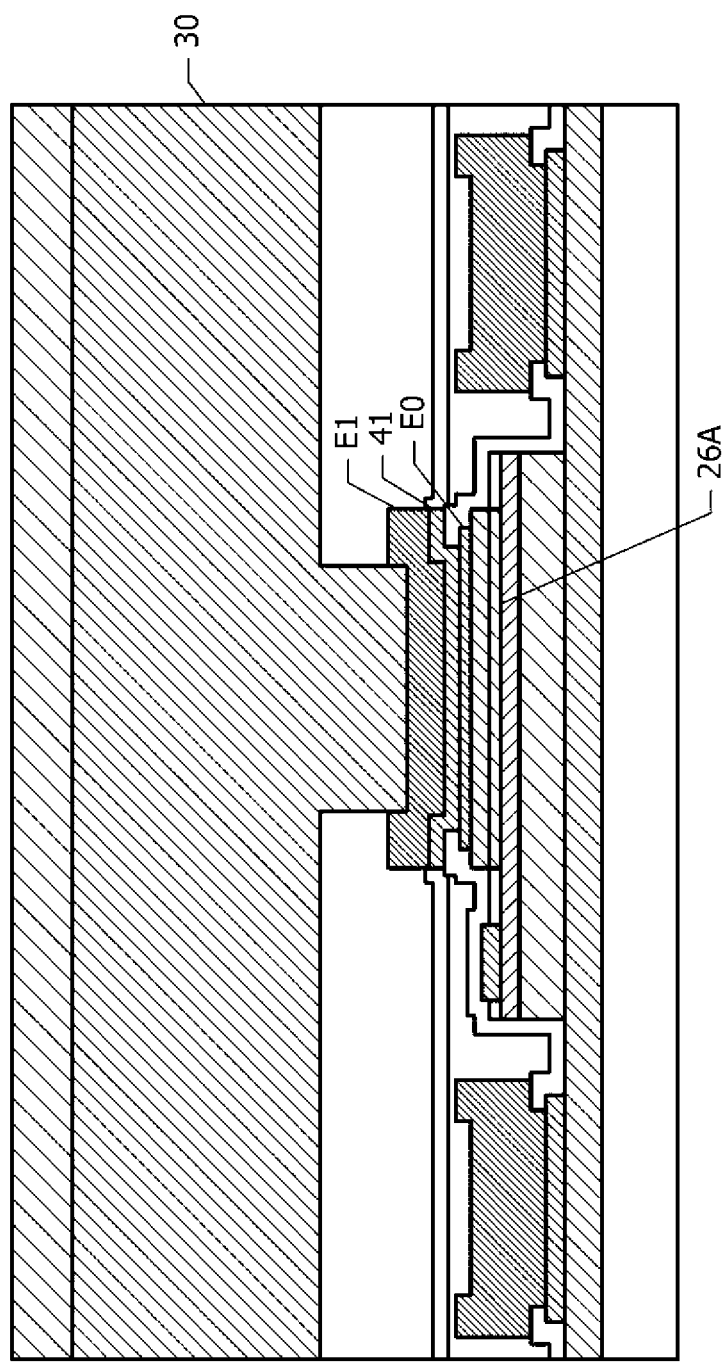
FIG. 8 is a sectional view of a semiconductor element according to a third embodiment.

FIG. 8 is a sectional view of the semiconductor element according to the third embodiment. In the second embodiment, the under bump metal layer 31 (FIG. 6) used as an underlayer of the bump 30 functions as a stress-relaxing layer. In the third embodiment, the under bump metal layer 31 is not arranged, and a stress-relaxing layer 41 is arranged below the emitter wiring lines E1 of the first layer instead of the under bump metal layer 31. The emitter wiring lines E1 of the first layer are connected to the emitter electrodes E0 via the stress-relaxing layer 41.

Figure 9:
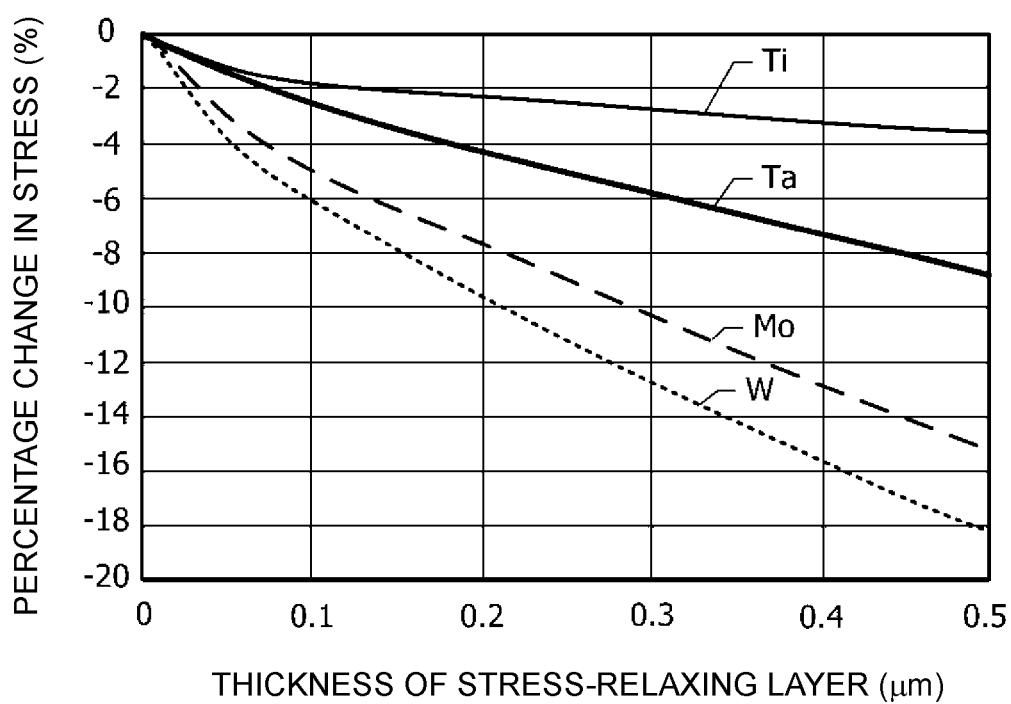
FIG. 9 is a graph illustrating the percentage change in the maximum value of the thermal stress generated in an intrinsic emitter layer in the third embodiment using a case in which a stress-relaxing layer is not arranged as a reference.

FIG. 9 is a graph illustrating the percentage change in the maximum value of the thermal stress generated in the intrinsic emitter layer 26A (FIG. 8) using a case in which the stress-relaxing layer 41 is not arranged as a reference. The horizontal axis represents the thickness of the stress-relaxing layer 41 in units of μm, and the vertical axis represents the stress percentage change in units of %. The simulation was performed using four different high-melting-point metals, namely, Ti, Ta, Mo, and W, for the stress-relaxing layer.

It was confirmed that the thermal stress falls as the thickness of the stress-relaxing layer 41 increases and that the stress-relaxing layer 41 has a function of relaxing thermal stress. The stress-relaxing layer 41 is arranged below the emitter wiring lines E1 of the first layer in the example illustrated in FIG. 8, but the stress-relaxing layer 41 may instead be arranged above or inside the emitter wiring lines E1 of the first layer.

Fourth Embodiment

Next, a semiconductor element according to a fourth embodiment will be described while referring to FIG. 10. Hereafter, the description of the parts of the configuration that are the same as in the semiconductor element according to the second embodiment illustrated in FIGS. 5, 6, and 7 will be omitted.

A Ti film having a thickness of 50 nm is used as each of the emitter electrodes E0 in the second embodiment, whereas the Ti film constituting each of the emitter electrodes E0 is made thicker or a high-melting-point metal other than Ti is used as each of the emitter electrodes E0 in the fourth embodiment. In addition, the under bump metal layer 31 (FIG. 6) functioning as a stress-relaxing layer is not arranged.

Figure 10:
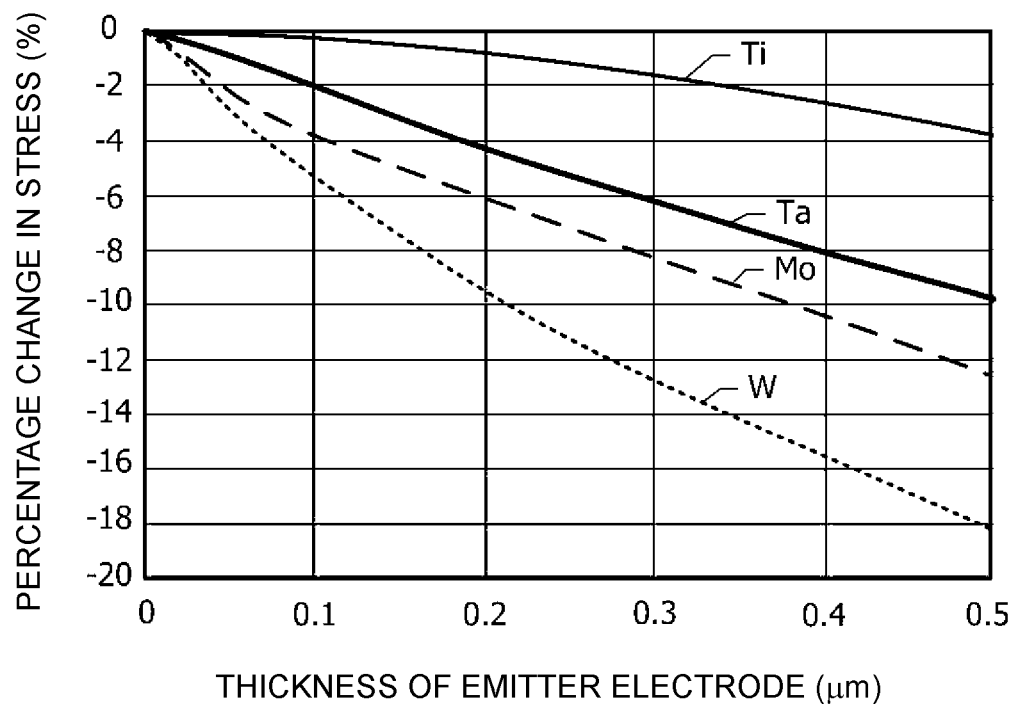
FIG. 10 is a graph illustrating the percentage change in the maximum value of the thermal stress generated in an intrinsic emitter layer in the fourth embodiment using a case in which an emitter electrode serving as a stress-relaxing layer is not arranged as a reference.

FIG. 10 is a graph illustrating the percentage change in the maximum value of the thermal stress generated in the intrinsic emitter layer 26A using a case in which the emitter electrode E0 functioning as a stress relaxing layer is not arranged as a reference. The horizontal axis represents the thickness of each of the emitter electrodes E0 in units of μm, and the vertical axis represents the stress percentage change in units of %. The simulation was performed using four different high-melting-point metals, namely, Ti, Ta, Mo, and W, as the emitter electrode E0.

It was confirmed that thermal stress falls as the thickness of each of the emitter electrodes E0 increases and that the emitter electrode E0 has a function of relaxing thermal stress.

Thickness of Stress-Relaxing Layer

Next, the preferred thickness of the stress-relaxing layer derived from the simulation results for the stress percentage change for the semiconductor elements according to the second embodiment, the third embodiment, and the fourth embodiment will be described. Stress-relaxing layers constituted by the under bump metal layer 31 (FIG. 6), the stress-relaxing layer 41 (FIG. 8), the emitter electrodes E0 (FIG. 10), and so forth, were formed so as to be very thin and then subjected to an HBT lifetime test. As a result, it was clear that the HBTs became degraded in a short period of time and that it would be difficult to put these HBTs to actual use. This is due to semiconductor layers such as the intrinsic emitter layer 26A being damaged by the thermal stress. When the thermal stress generated in the intrinsic emitter layer 26A was reduced by around 2% by arranging a stress-relaxing layer, the lifetime of the HBT was extended around thirty-five fold. This lifetime lies in the range where the HBT can withstand actual use.

When the absolute value of the stress percentage change, obtained using the thermal stress in the case where a stress-relaxing layer is not arranged as a reference, becomes greater than or equal to 2%, the lifetime of the HBT is further extended. However, the rate of the increase of the lifetime is gentler in the range where the absolute value of the stress percentage change is greater than or equal to 2%. For example, in the case where the stress percentage change is −28%, the lifetime of the HBT is merely extended 41 fold. From these evaluation results, in order to extend the lifetime of an HBT, it is thought that the thermal stress generated in the intrinsic emitter layer 26A is preferably reduced by 2% or more compared with the case where a stress-relaxing layer is not arranged.

From the simulation results illustrated in FIGS. 7, 9, and 10, in order to extend the lifetime of an HBT, it is thought that a sufficient lifetime can be secured by making the thickness of a stress-relaxing layer in which Ta, Mo, Cr, or W is used as a high-melting point metal greater than or equal to 100 nm. Furthermore, it is thought that a sufficient lifetime can be secured by making the thickness of the stress-relaxing layer greater than or equal to 100 nm in the case where a stress-relaxing layer composed of an alloy or a compound containing such a high-melting point metal is used.

It is thought that a sufficient lifetime can be secured by making the thickness of a stress-relaxing layer in which Ti is used as the high-melting point metal greater than or equal to 300 nm. Furthermore, in the case where a stress-relaxing layer composed of an alloy or a compound containing Ti is used, it is thought that a sufficient lifetime can be secured by making the thickness of the stress-relaxing layer greater than or equal to 300 nm.

In the case where the stress-relaxing layer contains Ti and one high-melting point metal selected from among Ta, Mo, Cr, and W, it is sufficient that the thickness of the stress-relaxing layer be greater than or equal to 100 nm. For example, in the case where a TiW alloy is used for the stress-relaxing layer, it is sufficient that the thickness of the stress-relaxing layer be greater than or equal to 100 nm, and in the case where a TiAl alloy is used for the stress-relaxing layer, it is sufficient that the thickness of the stress-relaxing layer be greater than or equal to 300 nm.

From the viewpoint of electrical resistance, it is not preferable for the stress-relaxing layer to be too thick. A practical value of the emitter resistance, which affects the performance of the HBT, is around $0.1\Omega$ per unit emitter area of 100 μm$^2$. The resistance value of the stress-relaxing layer is preferably made at least one order of magnitude smaller than the practical value of the emitter resistance. In other words, the resistance value is preferably less than or equal to $0.01\Omega$. The electrical resistance of Ti, Ta, Mo, Cr, W, or the like used for the stress-relaxing layer is generally on the order of $10^{-7}$ $\Omega$m. It is preferable that the thickness of the stress-relaxing layer be made less than or equal to 10 μm for example in order to make the resistance of the stress-relaxing layer less than or equal to $0.01\Omega$ assuming that the stress-relaxing layer contacts the emitter electrode via an opening having an area around the same size as the emitter area.

Fifth Embodiment

Next, a semiconductor element according to a fifth embodiment will be described while referring to FIGS. 11 and 12. Hereafter, the description of the parts of the configuration that are the same as in the semiconductor element according to the first embodiment is omitted. The semiconductor element according to the first embodiment includes a bipolar transistor, whereas the semiconductor element according to the fifth embodiment includes an electric field effect transistor (FET) instead of a bipolar transistor.

Figure 11:
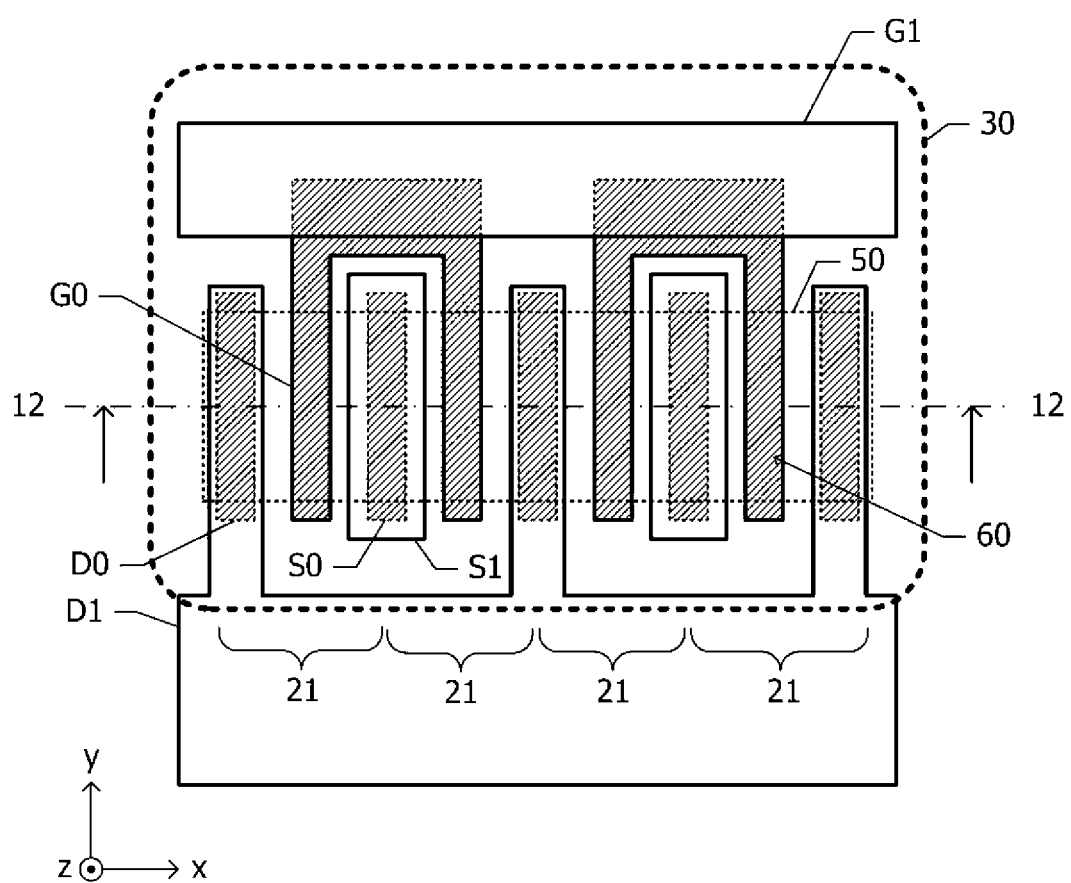
FIG. 11 is a plan view of a semiconductor element according to a fifth embodiment.

FIG. 11 is a plan view of the semiconductor element according to the fifth embodiment. An xyz orthogonal coordinate system is defined such that an upper surface of a substrate lies in an xy plane and a direction that is normal to this upper surface is a positive z axis direction. A plurality of unit transistors 21 are arrayed in the x axis direction. The plurality of unit transistors 21 are connected in parallel with each other, and thereby one electric field effect transistor is formed. In FIG. 11, an example is illustrated in which four unit transistors 21 are arranged. Each unit transistor 21 is a MESFET.

Each of the unit transistors 21 includes a gate electrode G0, a source electrode S0, and a drain electrode D0. In FIG. 11, the gate electrodes G0, the source electrodes S0, and the drain electrodes D0 are shaded with hatching. A substantially rectangular active region 50 that extends in the x axis direction and four gate electrodes G0 each of which extends in the y axis direction are crossed with each other. The plurality of gate electrodes G0 are connected to each other outside the active region 50. For example, in FIG. 11, the two gate electrodes G0 on the left side are connected to each other, and the two gate electrodes G0 on the right side are connected to each other. All of the gate electrodes G0 are electrically connected to a gate wiring line G1 of the first layer.

A drain electrode D0 is arranged on one side of each gate electrode G0, and a source electrode S0 is arranged on the other side of each gate electrode G0. Adjacent unit transistors 21 share one source electrode S0 or one drain electrode D0. In FIG. 11, an example is illustrated in which two source electrodes S0 and three drain electrodes D0 are arranged.

Comb-tooth parts of a comb-shaped first drain wiring line D1 are arranged so as to be overlapped with the three drain electrodes D0 and are electrically connected to the drain electrodes D0. The plurality of comb-tooth parts of the first drain wiring line D1 of the first layer are connected to each other outside the active region 50.

Each of the first layer source wiring lines S1 is arranged so as to be overlapped with each of the source electrodes S0. The source wiring lines S1 consist of a plurality of conductor patterns that are arranged so as to respectively correspond to the source electrodes S0. The plurality of conductor patterns that constitute the source wiring lines S1 of the first layer are electrically connected to each other by a bump 30.

The parts where the active region 50 and the gate electrodes G0 are overlapped are parts where the drain current is controlled in FET operation. In this specification, the parts where the active region 50 and the gate electrodes G0 are overlapped are referred to as operation regions 60. A plurality of operation regions 60 are arranged inside the bump 30 in a plan view.

Figure 12:
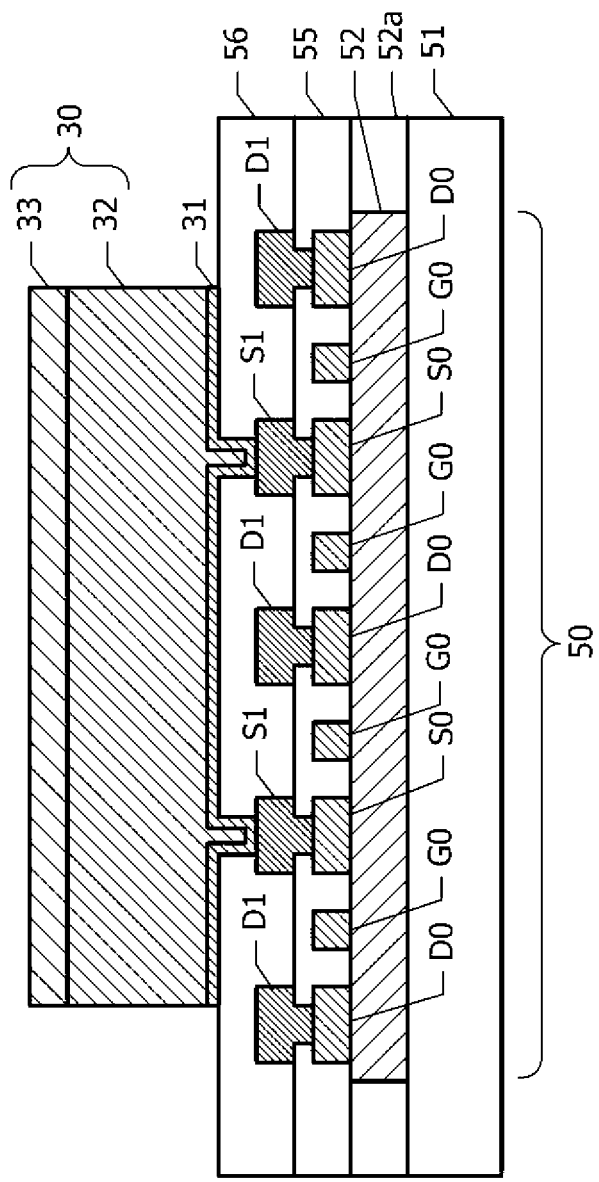
FIG. 12 is a sectional view taken along a one-dot dash line 12-12 in FIG. 11.

FIG. 12 is a sectional view taken along a one-dot dash line 12-12 in FIG. 11. A channel layer 52 composed of n-type GaAs is epitaxially grown on a substrate 51 composed of semi-insulating GaAs. A region occupying a part of the channel layer 52 is made insulating using an ion injection technique and serves as an isolation region 52a. The active region 50 is demarcated by the isolation region 52a.

Two source electrodes S0, four gate electrodes G0, and three drain electrodes D0 are arranged so as to contact the channel layer 52. An insulating film 55 is arranged so as to cover these electrodes. The insulating film 55 has a single-layer structure composed of a SiN film or a two-layer structure composed of a SiN film and a polyimide film, for example.

The drain wiring line D1 and the source wiring lines S1 of the first layer are arranged on the insulating film 55. The drain wiring line D1 of the first layer is electrically connected to the drain electrodes D0 via openings provided in the insulating film 55. The source wiring lines S1 of the first layer are electrically connected to the source electrodes S0 via openings provided in the insulating film 55. The gate wiring line G1 of the first layer (FIG. 11) is also arranged on the insulating film 55. The drain wiring line D1, the source wiring lines S1, and the gate wiring line G1 of the first layer for example have a two-layer structure consisting of a Ti film having a thickness of around 50 nm and an Au film having a thickness of around 1 μm arranged on the Ti film.

An upper-layer insulating film 56 is arranged on the insulating film 55 so as to cover these wiring lines of the first layer. The insulating film 56 has a single-layer structure composed of a SiN film or a two-layer structure composed of a SiN film and a polyimide film, for example.

The bump 30 is arranged on the insulating film 56. The bump 30 has a two-layer structure consisting of a metal post 32 and a solder layer 33 similarly to the bump 30 of the semiconductor element according to the first embodiment (FIG. 2). An under bump metal layer 31 is arranged as an underlayer of the bump 30. The under bump metal layer 31 functions as a stress-relaxing layer similarly to as in the case of the semiconductor element according to the first embodiment.

Next, favorable effects obtained as a result of adopting the configuration of the semiconductor element according to the fifth embodiment will be described.

When a bump is arranged directly above an FET, thermal stress is readily generated in a semiconductor region of the FET due to the difference between the thermal expansion coefficients of the bump material and the semiconductor material. When thermal stress is generated in a semiconductor region, in particular, in the operation regions 60, it is likely that the FET will have decreased reliability, there will be variations in the electrical characteristics of the FET, the FET will have inferior characteristics, and so on. In particular, in the channel layer 52 composed of a compound semiconductor such as GaAs, piezo-charge is generated due to the thermal stress generated in the vicinity of the gate electrodes G0. Due to the piezo-charge, variations in the threshold voltage and so forth are generated and variations in characteristics are increased.

In the fifth embodiment, the under bump metal layer 31 functions as a stress-relaxing layer, and therefore variations in characteristics, inferior characteristics, decreased reliability, and so on caused by the thermal stress can be suppressed.

In addition, the plurality of conductor patterns constituting the source wiring lines S1 of the first layer are electrically connected to each other by the bump 30, and therefore there is no need to arrange another wiring line layer to connect these conductor patterns to each other. Therefore, the number of wiring line layers can be reduced, and as a result a reduction in the manufacturing cost can be achieved.

Figure 13:
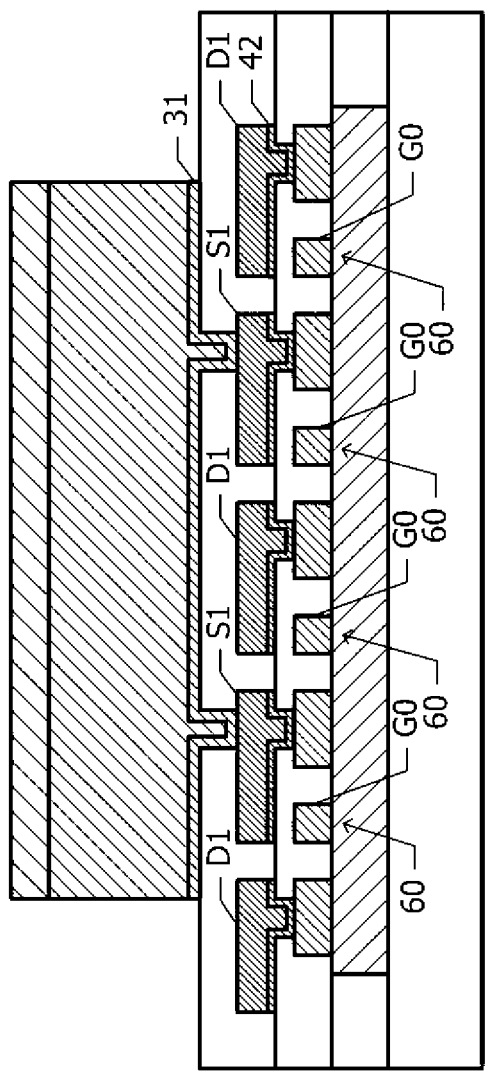
FIG. 13 is a sectional view of a semiconductor element according to a modification of the fifth embodiment.

Next, a semiconductor element according to a modification of the fifth embodiment will be described while referring to FIG. 13. In the fifth embodiment, the under bump metal layer 31 is used as a stress-relaxing layer, whereas in this modification, a stress-relaxing layer 42 is arranged below the source wiring lines S1 and the drain wiring line D1 of the first layer similarly to the stress-relaxing layer 41 (FIG. 8) of the semiconductor element according to the third embodiment. The source wiring lines S1 and the drain wiring line D1 are made to extend to regions directly above the gate electrodes G0 such that the stress-relaxing layers 42 are arranged directly above the operation regions 60. Thus, the stress that may be generated in the operation regions 60 can be reduced. In the case where the stress-relaxing layer 42 is arranged, the under bump metal layer 31 does not need to be given a function of relaxing the stress. Therefore, compared with the case of the fifth embodiment, the under bump metal layer 31 may be made thinner.

In addition, the gate electrodes G0 may be formed using a high-melting-point metal and may be made to function as a stress-relaxing layer similarly to the emitter electrodes E0 that functions as a stress-relaxing layer of the semiconductor element according to the fourth embodiment (FIG. 6). In addition, a part of each gate electrode G0 may be a layer composed of a high-melting-point metal.

Thus, even when a stress-relaxing layer is arranged in a part of a wiring line layer or a gate electrode G0 of the first layer, the thermal stress generated in an operation region 60 can be reduced similarly to as in the fifth embodiment.

Each of the above-described embodiments is an illustrative example and it goes without saying that parts of the configurations illustrated in different embodiments can be substituted for one another or combined with each other. The same operational effect resulting from the same configurations in a plurality of embodiments are not repeatedly described in the individual embodiments. In addition, the present disclosure is not limited to the above-described embodiments. For example, it will be clear to a person skilled in the art that various changes, improvements, and combinations are possible.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor element comprising:
   a transistor including a substrate, a semiconductor region and three different terminal electrodes, wherein the semiconductor region is provided on the substrate, and at least one of the terminal electrodes has an isolated electrode structure consisting of a plurality of conductor patterns;
   a bump arranged on the at least one of the terminal electrodes having the isolated electrode structure and electrically connecting the plurality of conductor patterns to each other; and
   a stress-relaxing layer arranged between the semiconductor region of the transistor and the bump and composed of a metal material containing a high-melting-point metal;
   wherein no current path for connecting the plurality of conductor patterns to each other is arranged between the conductor patterns and the bump.

2. The semiconductor element according to claim 1,
   wherein the stress-relaxing layer contains at least one high-melting-point metal selected from a group consisting of W, Mo, Ta, and Cr, and a thickness of the stress-relaxing layer is greater than or equal to 100 nm.

3. The semiconductor element according to claim 2,
   wherein the stress-relaxing layer is an underlayer of the bump and has a planar shape identical to a planar shape of the bump.

4. The semiconductor element according to claim 2,
   wherein the stress-relaxing layer constitutes a part of the at least one of the terminal electrodes having the isolated electrode structure.

5. The semiconductor element according to claim 2, further comprising:
   one wiring line layer arranged between the terminal electrodes and the bump;
   wherein the bump and the conductor patterns are connected to a wiring line contained in the wiring line layer without another wiring line layer being interposed therebetween.

6. The semiconductor element according to claim 2,
   wherein the transistor is a bipolar transistor including a collector layer, a base layer, and an emitter layer, and the three terminal electrodes include a collector electrode, a base electrode, and an emitter electrode connected to the collector layer, the base layer, and the emitter layer, respectively.

7. The semiconductor element according to claim 1,
   wherein the stress-relaxing layer contains Ti as the high-melting-point metal and the thickness of the stress-relaxing layer is greater than or equal to 300 nm.

8. The semiconductor element according to claim 7,
   wherein the stress-relaxing layer is an underlayer of the bump and has a planar shape identical to a planar shape of the bump.

9. The semiconductor element according to claim 7,
   wherein the stress-relaxing layer constitutes a part of the at least one of the terminal electrodes having the isolated electrode structure.

10. The semiconductor element according to claim 7, further comprising:
    one wiring line layer arranged between the terminal electrodes and the bump;
    wherein the bump and the conductor patterns are connected to a wiring line contained in the wiring line layer without another wiring line layer being interposed therebetween.

11. The semiconductor element according to claim 7,
    wherein the transistor is a bipolar transistor including a collector layer, a base layer, and an emitter layer, and the three terminal electrodes include a collector electrode, a base electrode, and an emitter electrode connected to the collector layer, the base layer, and the emitter layer, respectively.

12. The semiconductor element according to claim 1,
    wherein the stress-relaxing layer is an underlayer of the bump and has a planar shape identical to a planar shape of the bump.

13. The semiconductor element according to claim 4, further comprising:
    one wiring line layer arranged between the terminal electrodes and the bump;
    wherein the bump and the conductor patterns are connected to a wiring line contained in the wiring line layer without another wiring line layer being interposed therebetween.

14. The semiconductor element according to claim 1,
    wherein the stress-relaxing layer constitutes a part of the at least one of the terminal electrodes having the isolated electrode structure.

15. The semiconductor element according to claim 14, further comprising:
    one wiring line layer arranged between the terminal electrodes and the bump;
    wherein the bump and the conductor patterns are connected to a wiring line contained in the wiring line layer without another wiring line layer being interposed therebetween.

16. The semiconductor element according to claim 1, further comprising:
    one wiring line layer arranged between the terminal electrodes and the bump;
    wherein the bump and the conductor patterns are connected to a wiring line contained in the wiring line layer without another wiring line layer being interposed therebetween.

17. The semiconductor element according to claim 1,
    wherein the transistor is a bipolar transistor including a collector layer, a base layer, and an emitter layer, and the three terminal electrodes include a collector electrode, a base electrode, and an emitter electrode connected to the collector layer, the base layer, and the emitter layer, respectively.

18. The semiconductor element according to claim 17,
    wherein the emitter layer is arranged inside the bump in a plan view.

19. The semiconductor element according to claim 1,
    wherein the transistor is an electric field effect transistor including an active region demarcated by a surface layer portion of the substrate, and
    the three terminal electrodes include a source electrode, a drain electrode, and a gate electrode arranged on the active region.

20. The semiconductor element according to claim 19, wherein a region in which the gate electrode and the active region are overlapped is arranged inside the bump in a plan view.

\* \* \* \* \*